(12) United States Patent   (10) Patent No.: US 7,108,526 B2
Loibl et al.                     (45) Date of Patent:    Sep. 19, 2006

(54) COMPONENT AND CIRCUIT MODULE

(75) Inventors: Josef Loibl, Bad Abbach (DE); Georg Mentzel, Regensberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/004,340

(22) Filed: Dec. 3, 2004

(65) Prior Publication Data
US 2005/0124194 A1    Jun. 9, 2005

(30) Foreign Application Priority Data
Dec. 4, 2003    (DE) .............. 103 56 659

(51) Int. Cl.
*H01R 3/00* (2006.01)
(52) U.S. Cl. .................................... 439/164
(58) Field of Classification Search ........... 439/164, 439/15, 4, 364
See application file for complete search history.

(56) References Cited
U.S. PATENT DOCUMENTS
5,044,968 A * 9/1991 Bannai et al. ............ 439/164
5,993,228 A * 11/1999 Kubota ................... 439/164
2004/0209505 A1* 10/2004 Wade et al. ............. 439/164

FOREIGN PATENT DOCUMENTS
DE     22 52 954 B2    7/1979
DE     296 80 045 U1   11/1997

* cited by examiner

*Primary Examiner*—J. F. Duverne
(74) *Attorney, Agent, or Firm*—Baker Botts L.L.P.

(57) ABSTRACT

A component, equipped for rotational insertion into a circuit module, has at least one contact electrically coupled to a first terminus of a connecting wire. The connection wire has a second terminus electrically coupled to a counter-contact on the circuit module. The contact has an annular extension in the circumferential direction which encloses the counter-contact even when a radial center line of the contact area angular extension lies outside the counter-contact angular extension. The contact may be ring-segment shaped or ring shaped. Numerous contacts may be arranged at different radial distances from the component's axis of rotation.

12 Claims, 4 Drawing Sheets

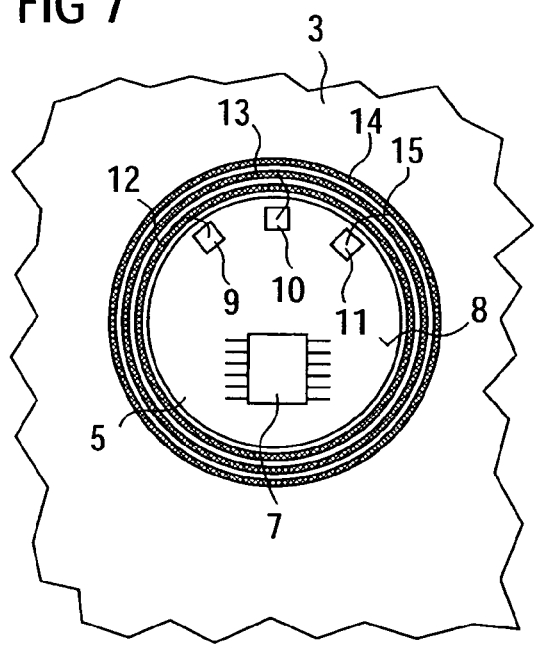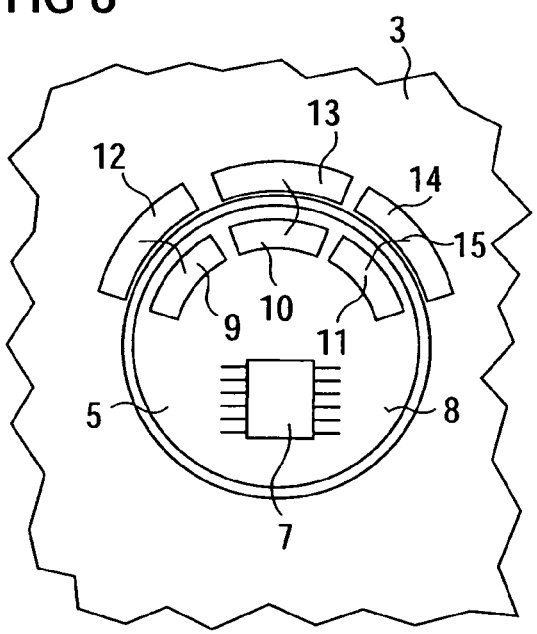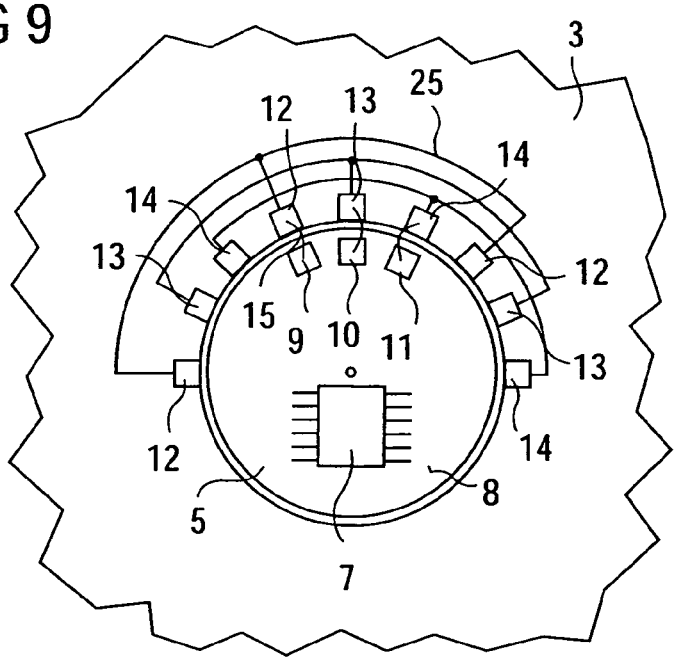

COMPONENT AND CIRCUIT MODULE

PRIORITY

This application claims priority to German application no. 103 56 659.7 filed Dec. 4, 2003.

TECHNICAL FIELD OF THE INVENTION

The invention relates to a component which is equipped for rotational insertion into a circuit module, and which has a contact to which can be attached connecting wires which lead to a counter-contact on the circuit module.

The invention relates further to a circuit module, into which the component which has a contact can be rotationally inserted, which has a counter-contact to which can be attached a connecting wire which leads to the contact.

DESCRIPTION OF THE RELATED ART

In motor vehicle design, pressure sensors, especially when high pressures are to be sensed, are screwed into a retaining structure. Electrical connections to the pressure sensors, which are in completely enclosed housings and are fitted with a plug-in connector, are normally made via the plug-in connector and external wiring. However, contacting by means of external wiring and separate plug-in connectors is mechanically demanding, because the plug-in connectors must not work loose even when subject to vibration loads.

In the field of electro-technology, it is generally known how bonded connections or soldered connections can be used to make connections to components and circuit boards. However, a prerequisite for a bonded connection is that there is a defined spacing between the contacts involved, because the maximum permissible bond length of the bondwires may not be exceeded.

The publication DE 22 52 954 B2 discloses a circuit module which is arranged to be rotatable, whereby components on the circuit module are aligned with contacts outside the circuit module by rotating the circuit module.

Also known, from the publication DE 296 80 045 U1, is an electrical device system which incorporates a base unit and an electrical device, in which the contact elements have an angular extension which enables contacting regardless of the relative rotational orientation.

SUMMARY OF THE INVENTION

Starting from this state of the art, the object underlying the invention is to devise a component with contacts and a circuit module with counter-contacts, by which the contacts and counter-contacts can be connected electrically in a simple and reliable manner.

This object can be achieved by a component, which is equipped for rotational insertion into a circuit module and which has at least one contact to which can be attached connecting wires which lead to at least one counter-contact on the circuit module, wherein the contact has an angular extension in the circumferential direction which extends as far as the counter-contact even when a radial center line of the angular extension of the contact area lies outside the angular extension of the counter-contact.

At least one contact can be ring-segment shaped or ring shaped. Numerous contacts can be arranged at different radial distances from an axis of rotation of the component.

The object can also be achieved by a circuit module, into which a component which is equipped with at least one contact can be rotationally inserted, and which has at least one counter-contact to which can be attached at least one connecting wire leading to a contact, wherein the counter-contact has an angular extension in a circumferential direction which extends as far as the contact area even when a radial center line of the angular extension of the counter-contact lies outside the angular extension of the contact.

At least one counter-contact can be ring-segment shaped or ring-shaped. Numerous counter-contacts can be arranged at different radial distances from an axis of rotation of the component.

The object can also be achieved by an arrangement comprising a circuit module comprising a base-plate and a circuit board comprising at least a first contact, a threaded component comprising an axis of rotation, and at least a second contact wherein the component can be screwed into the base-plate to be positioned in a nominal position in which the second contact is aligned with a set position with respect to the first contact and allows for bonding the first contact with the second contact with a predetermined maximum bond wire length, wherein the first or second contact extends angularly around a circumferential direction with respect to the axis of rotation to maintain the maximum bond wire length in case of a deviation from the set position when the component is screwed into the base-plate.

The at least first or second contact can be ring-segment shaped or ring shaped. A plurality of first and second contacts are arranged at different radial distances from the axis of rotation.

The component has, in particular, contacts which in a circumferential direction have an angular extension which extends as far as the counter-contact even if a radial center line through the angular extension of the contact surface lies outside the angular extension of the counter-contact. For its part, the circuit module is distinguished by the fact that in a circumferential direction the counter-contact has an angular extension which extends as far as the contact surface even if a radial center line through the angular extension of the counter-contact lies outside the angular extension of the contact.

This embodiment of the contacts and counter-contacts ensures that contacting can be effected using connecting wires of a predefined length even when the rotational position of the component which can be rotationally inserted into the circuit module is to one side of the set position, in which the contacts and their associated counter-contacts are positioned centrally opposite each other. The electrical connection between component and circuit module can thus be made, in particular, using the bonding method.

In this situation, the maximum possible angular deviation of the rotational position from the set position depends on the spatial design of the contacts and counter-contacts. With a preferred embodiment of the invention, the contacts on the component are ring-segment shaped. Because of its limited space requirement, this form of embodiment will be used in particular where the spatial proportions in the region of the component are restricted.

In a further preferred form of embodiment, the contacts on the component are ring-shaped. This permits an electrical connection to be established between the component and the circuit module irrespective of the rotational position of the component in the circuit module.

Apart from this, it is also possible to fashion the counter-contacts in such a way that their angular extension permits an electrical connection between the component and circuit module even when the rotational position of the component is to one side of the set position. With this embodiment, the contacts on the component can have normal dimensions. This form of embodiment is therefore advantageous, in particular, if there is little space available on the component for the contacts.

BRIEF DESCRIPTION OF THE DRAWINGS

Exemplary embodiments of the invention will be explained in more detail below by reference to the figures, in which;

FIG. 7 shows a plan view of an arrangement in which the counter-contacts are arranged at different radial distances from the pressure sensor and enclose it within a ring-shape;

FIG. 8 shows an exemplary embodiment in which both the contacts on the pressure sensor and also the counter-contacts on the circuit substrate are ring-segment shaped; and FIG. 9 shows a plan view of an exemplary embodiment in which the counter-contacts are subdivided into numerous contact areas, which are connected to each other electrically by conducting tracks and are distributed around the pressure sensor in a circumferential direction.

DETAILED DESCRIPTION OF THE PREFERRED EMBODIMENTS

Figure 1:
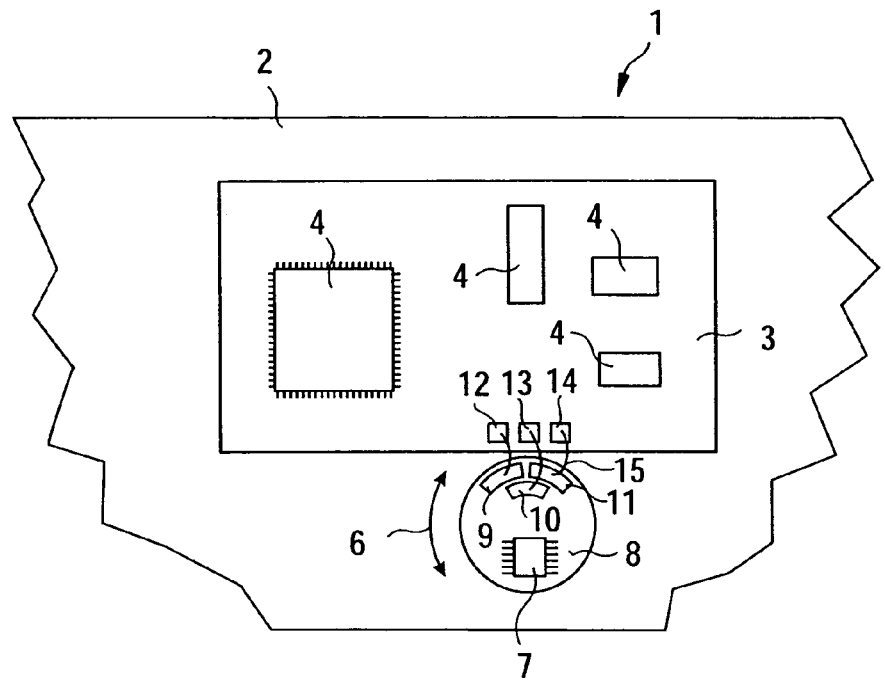
FIG. 1 shows a plan view of the base-plate of a circuit module with the circuit substrate arranged on it and the screwed-in pressure sensor.

FIG. 1 shows a circuit module 1 which has a base-plate 2 with a circuit board 3 attached to it. The base-plate 2 and the circuit board 3 are normally covered over by a cover, which is not shown. On the circuit board 3 there are components 4, of which some are shown in FIG. 1.

In addition, a pressure sensor 5 can be screwed into the base-plate 2, this turning in a rotational direction 6 when it is screwed in. The pressure sensor 5 also incorporates a sensor circuit, of which one representative component 7 is shown in FIG. 1, this being arranged on the rear side 8 of the pressure sensor 5. To enable connections to be made to the sensor circuit of the pressure sensor 5, contacts 9, 10 and 11 are provided on the rear side 8 of the pressure sensor 5. When the pressure sensor 5 is in a set position, the contacts 9, 10 and 11 lie opposite counter-contacts 12, 13 and 14, on the circuit board 3. The term set position means that rotational position of the pressure sensor 5 in which the contacts 9, 10 and 11 and the counter-contacts 12, 13 and 14, each of which is assigned to one of the contacts 9, 10 and 11, lie centered opposite each other. In this case, an electrical connection can be made between the contacts 9, 10 and 11 and their counter-contacts 12, 13 and 14 using bondwires 15, such that the length of the bondwires 15 does not exceed the maximum permissible length.

It should be noted that it is also possible to use flexible conducting foils instead of bondwires 15. Normally, the bondwires 15 or the conducting foils will be bonded or soldered onto the contacts 9, 10 and 11 and onto the counter-contacts 12, 13 and 14.

Figure 2A:
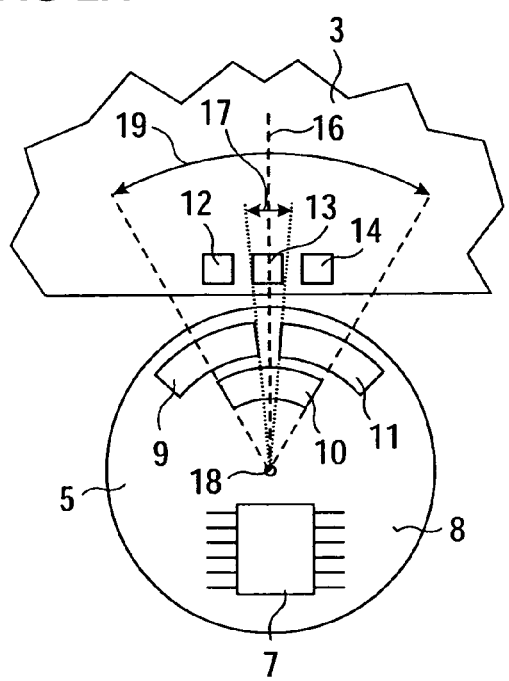
FIGS. 2A and 2B show the arrangement shown in FIG. 1 with the pressure sensor in its set position, and in a rotational position to one side of the set position.
Figure 2B:
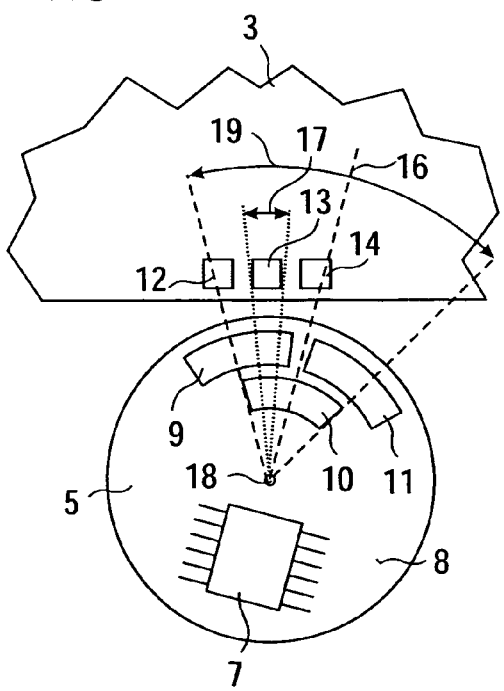

FIGS. 2A and 2B show an enlarged view of the arrangement in FIG. 1, in different rotational positions. In FIG. 2A, a center line 16 associated with the contact 10 lies within the angular extension 17 of the counter-contact 13. In FIG. 2A, the limits of this angular extension 17 are represented by dotted lines. The angular extension 17 corresponds to the angle subtended by the counter-contact 13 when viewed from an axis of rotation 18. The center line 16 corresponds to the angular bisector of the angular extension 19 of the contact 10. The angular extension 19 corresponds to the angle subtended by the contact 10 when viewed from an axis of rotation 18. If the center line 16 is now turned so that it is outside the angular extension 17, as shown in FIG. 2B, the angular extension 19 of the contact 10 is still sufficient to cover the counter-contact 13. With the rotational position shown in FIG. 2B contacting is still possible between the contact 10 and the counter-contact 13 using one of the bondwires 15 with a predefined length. This does not require the tool used for making the bond to be reset, because the contacts 9, 10 and 11 provide sufficient contact area, provided that the angular extension 19 of each of the contacts 9, 10 and 11 extends over the associated counter-contacts 12, 13 and 14.

With the exemplary embodiments illustrated by reference to FIGS. 1, 2A and 2B it is therefore not essential for the pressure sensor 5 to be in the set position after it is screwed in so that contacting between the contacts 9, 10 and 11 and the counter-contacts 12, 13 and 14 is possible. Further, deviations from the set position can also be accommodated so long as the angular extensions 19 of the contacts 9, 10 and 11 also extend over their counter-contacts 12 or 13 or 14 respectively.

Hence, generous tolerances can be permitted in the manufacture of the pressure sensor 5 and the base-plate 2, and in their assembly. This greatly simplifies the manufacture.

Figure 3A:
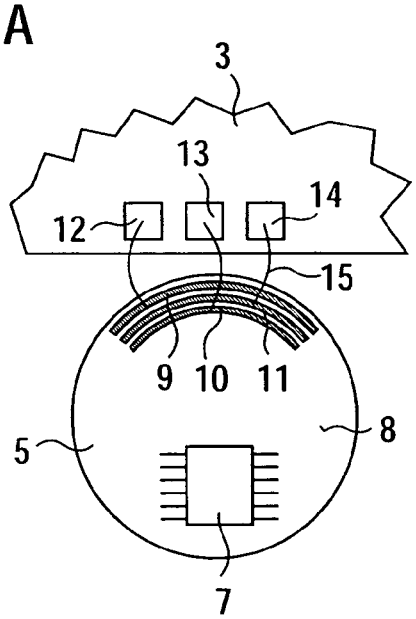
FIGS. 3A and 3B show plan views of different rotational positions of an exemplary embodiment of the pressure sensor, with ring-segment shaped contacts arranged in different radial positions.
Figure 3B:
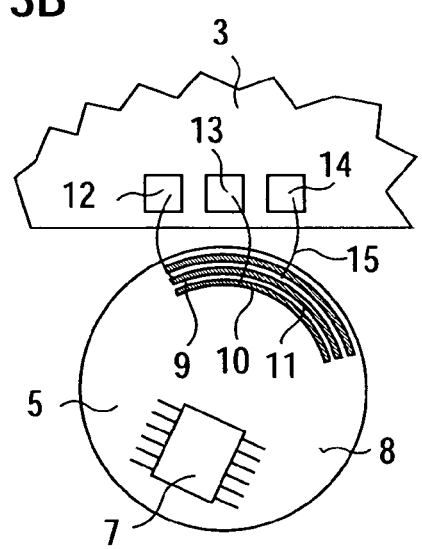

FIGS. 3A and 3B show another exemplary embodiment of the pressure sensor 5, in different rotational positions. In FIG. 3A, the pressure sensor 5 is in the set position, whereas in FIG. 3B the pressure sensor 5 assumes a rotational position to one side of the set position.

The pressure sensor 5 as shown in FIGS. 3A and 3B is distinguished by contacts 9, 10 and 11, each of which is ring-segment shaped, and which run alongside each other in a circumferential direction at different radial distances from the axis of rotation 18. With an arrangement of this type, it is possible to substantially increase the rotational angle by which the pressure sensor 5 may deviate from the set position.

Figure 4A:
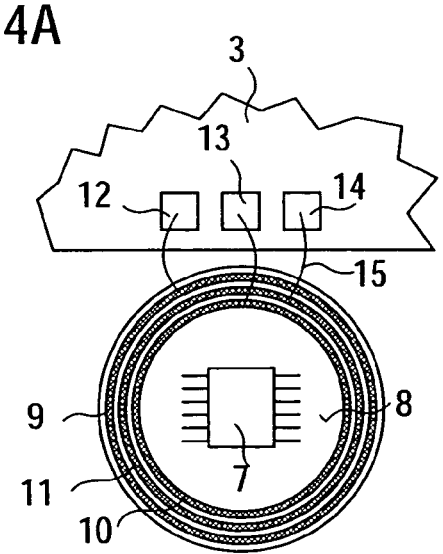
FIGS. 4A and 4B show plan views of different rotational positions of an exemplary embodiment, with ring shaped contacts.
Figure 4B:
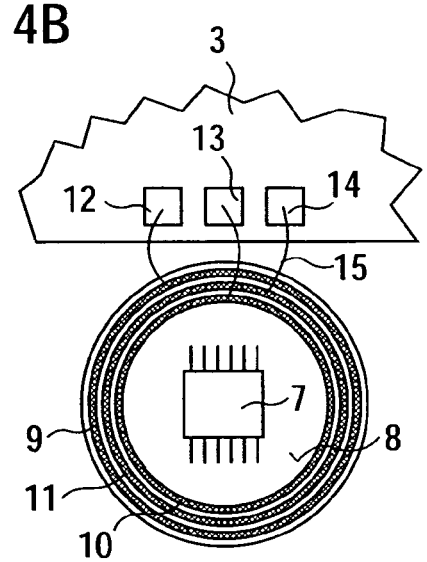

With the exemplary embodiment shown in FIGS. 4A and 4B, the rotational position of the pressure sensor 5 is no longer a factor. Since the ring-shaped contacts 9, 10 and 11, which are arranged at different radial distances from the axis of rotation 18, run unbroken around the rear side 8 of the pressure sensor 5, contacting between the counter-contacts 12, 13 and 14 and the contacts 9, 10 and 11 can be achieved completely independently of the rotational position of the pressure sensor 5.

Figure 5A:
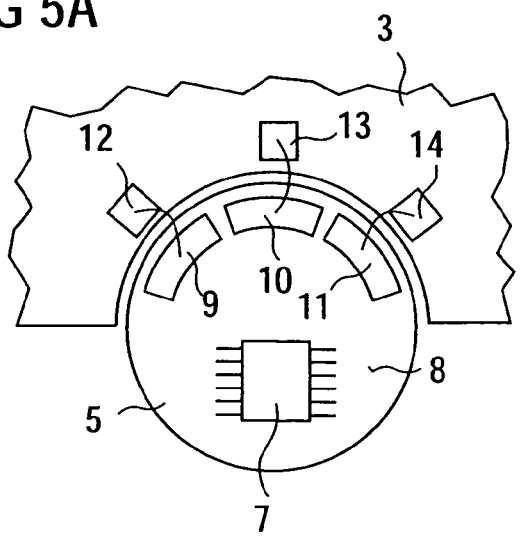
FIGS. 5A and 5B show plan views of different rotational positions of an exemplary embodiment, in which the counter-contacts are distributed around the pressure sensor in a circumferential direction.
Figure 5B:
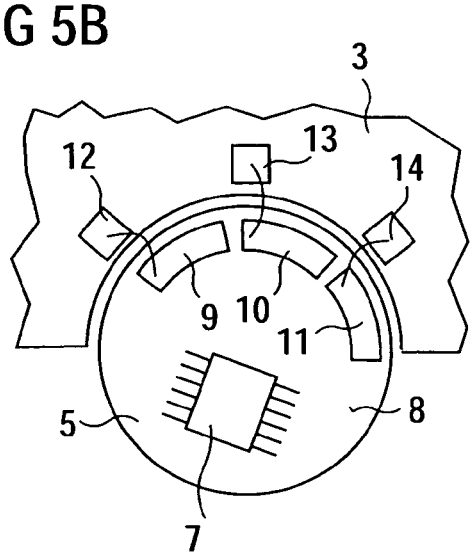

FIGS. 5A and 5B show plan views of another exemplary embodiment, in which the circuit board 3 has a semicircular cutout 20. The pressure sensor 5 has been screwed through the base-plate 2 into this cutout 20. The counter-contacts 12, 13 and 14 are arranged along the cutout 20 opposite the contacts 9, 10 and 11. An arrangement of this type suggests itself when the sensor 5 has a small diameter and there is only a small space available on the rear side 8 of the pressure sensor 5 for the contacts 9, 10 and 11.

Figure 6A:
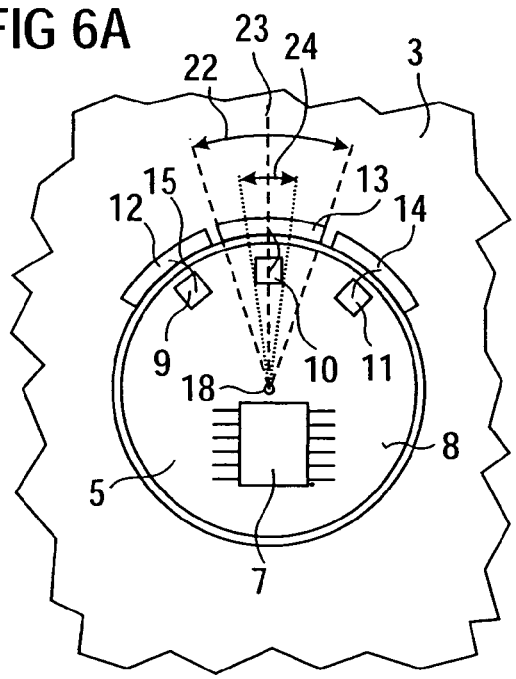
FIGS. 6A and 6B show plan views of an exemplary embodiment in which the counter-contacts are ring-segment shaped and are arranged around the pressure sensor in a circumferential direction.
Figure 6B:
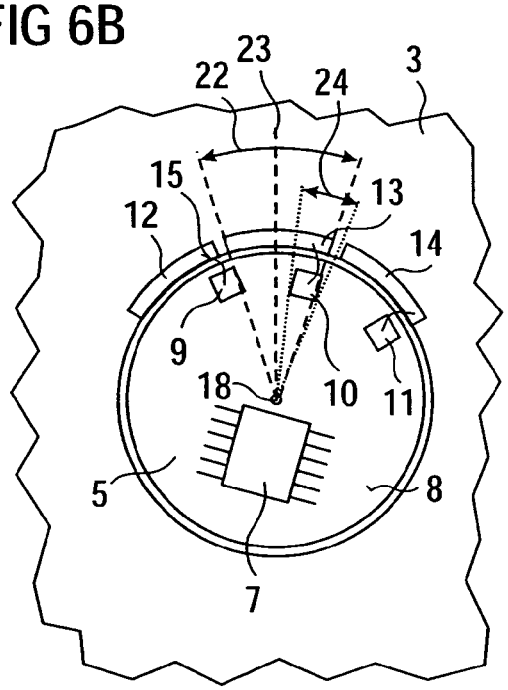

FIGS. 6A and 6B also show an exemplary embodiment whereby the contacts 9, 10 and 11 require only a small space on the rear side 8 of the pressure sensor 5. In this exemplary embodiment, the pressure sensor 5 has been screwed through the base-plate 2 into a circular-shaped opening 21 in the circuit board 3. Opposite the contacts 9, 10 and 11 are arranged the ring-segment shaped counter-contacts 12, 13 and 14. Each of the ring-segment shaped counter-contacts 12, 13 and 14 has an angular extension 22. For the sake of clarity, in FIG. 6A and in FIG. 6B only the angular extension of the counter-contact 13 is drawn in. The angular extension 22 corresponds to the angle subtended by the counter-contact 13 when viewed from the axis of rotation 18 of the pressure sensor 5. In FIGS. 6A and 6B, each end of the angular extension 22 is indicated by a dashed line. Further, in FIGS. 6A and 6B a center line 23 is drawn in, this corresponding to the angular bisector of the angular extension 22. The angular extension 22 of the counter-contact 13 is significantly greater than the angular extension 24 of the contact 10 associated with counter-contact 13, the limits of which are indicated in FIGS. 6A and 6B by dotted lines.

In FIG. 6A the pressure sensor 5 is in the set position. In FIG. 6B on the other hand, the pressure sensor 5 has been turned out of the set position. Hence the center line 23 is no longer within the angular extension 24 of the contact 10. However, due to the large angular extension 22 of the counter-contact 13, contacting is still possible without difficulty between the contact 10 and the counter-contact 13.

FIG. 7 displays another exemplary embodiment, in which the circular-shaped opening 21 is surrounded by ring-shaped counter-contacts 12, 13 and 14. As in the case of the exemplary embodiment shown in FIG. 4A and FIG. 4B, this arrangement enables contacting between the contacts 9, 10 and 11 and the counter-contacts 12, 13 and 14 independently of the rotational position of the pressure sensor 5.

In addition, both the contacts 9, 10 and 11 and also the counter-contacts 12, 13 and 14 can be given an angular extension in the circumferential direction which enables an electrical connection between the contacts 9, 10 and 11 and the counter-contacts 12, 13 and 14 irrespective of the rotational position of the pressure sensor 5. An exemplary embodiment of this type is shown in FIG. 8. In the case of this exemplary embodiment, ring-segment shaped contacts 9, 10 and 11 and ring-segment shaped counter-contacts 12, 13 and 14, are arranged alongside each other in a circumferential direction. By comparison with the exemplary embodiment shown in FIGS. 5A and 5B, this virtually doubles the tolerance in respect of an angular deviation from the set position, without requiring more space on the rear side 8 of the pressure sensor 5.

Finally, FIG. 9 shows an exemplary embodiment whereby the counter-contacts 12, 13 and 14 are subdivided into numerous individual contact points, arranged alongside one another in the circumferential direction, which are electrically connected to each other by conducting tracks 25 on the circuit board 3.

The exemplary embodiments described exhibit a range of advantages.

The pressure sensor 5 can be screwed into the base-plate 2 of the circuit module using a screw connection which is capable of withstanding high pressures, for example up to 2000 bar. In spite of this, the electrical connection between the pressure sensor 5 and the circuit board 3 can be effected using one of the conventional bonding methods, whereby generous tolerances can be allowed for any deviation of the rotational position of the pressure sensor 5 from its set position. The methods used in the manufacture of the base-plate 2 and the pressure sensor 5 can use process steps on which no special requirements must be imposed. Instead, the usual methods for the manufacture of threads can be used. This saves on costs, and raises the quality in the manufacture of the circuit module 1.

We claim:

1. A component, which is equipped for rotational insertion into a circuit module and which has at least one contact in contact with a first end of a connecting wire which leads to at least one counter-contact on the circuit module, wherein the contact has an angular extension in the circumferential direction which extends as far as the counter-contact even when a radial center line of the angular extension of the contact area lies outside the angular extension of the counter-contact.

2. The component in accordance with claim 1, wherein at least one contact is ring-segment shaped.

3. The component in accordance with claim 1, wherein at least one contact is ring shaped.

4. The component in accordance with claim 1, wherein numerous contacts are arranged at different radial distances from an axis of rotation of the component.

5. A circuit module, into which a component which is equipped with a contact can be rotationally inserted, and which has at least one counter-contact in contact with a first end of a connecting wire leading to the contact, wherein the counter-contact has an angular extension in a circumferential direction which extends as far as the contact area even when a radial center line of the angular extension of the counter-contact lies outside the angular extension of the contact.

6. The circuit module in accordance with claim 5, wherein at least one counter-contact is ring-segment shaped.

7. The circuit module in accordance with claim 5, wherein at least one counter-contact is ring-shaped.

8. The circuit module in accordance with claim 5, wherein numerous counter-contacts are arranged at different radial distances from an axis of rotation of the component.

9. An arrangement comprising:
a circuit module comprising a base-plate and a circuit board comprising at least a first contact;
a threaded component comprising an axis of rotation, and at least a second contact wherein the component is suitable for screwing into the base-plate to be positioned in a nominal position in which said second contact is aligned with a set position with respect to said first contact and allows for bonding said first contact with said second contact with a bond wire having a predetermined maximum length, wherein the first or second contact extends angularly around a circumferential direction with respect to the axis of rotation to maintain said maximum bond wire length in case of a deviation from said set position when said component is screwed into said base-plate.

10. The arrangement in accordance with claim 9, wherein said at least first or second contact is ring-segment shaped.

11. The arrangement in accordance with claim 9, wherein said at least first or second contact is ring shaped.

12. The arrangement in accordance with claim 9, wherein a plurality of first and second contacts are arranged at different radial distances from said axis of rotation.

* * * * *